US006185724B1

(12) United States Patent
Ochotta

(10) Patent No.: US 6,185,724 B1
(45) Date of Patent: Feb. 6, 2001

(54) TEMPLATE-BASED SIMULATED ANNEALING MOVE-SET THAT IMPROVES FPGA ARCHITECTURAL FEATURE UTILIZATION

(75) Inventor: Emil S. Ochotta, Campbell, CA (US)

(73) Assignee: Xilinx, Inc., San Jose, CA (US)

( * ) Notice: Under 35 U.S.C. 154(b), the term of this patent shall be extended for 0 days.

(21) Appl. No.: 08/982,847

(22) Filed: Dec. 2, 1997

(51) Int. Cl.$^7$ ................................................ G06F 17/50

(52) U.S. Cl. ........................................ 716/16; 716/18

(58) Field of Search ..................... 395/500.02–500.19; 716/1–21

(56) References Cited

U.S. PATENT DOCUMENTS

| Re. 34,363 | 8/1993 | Freeman | 326/38 |
|---|---|---|---|
| 4,642,487 | 2/1987 | Carter | 326/41 |
| 4,706,216 | 11/1987 | Carter | 365/94 |
| 4,758,745 | 7/1988 | Elgamal et al. | 326/16 |
| 4,870,302 | 9/1989 | Freeman | 326/41 |
| 5,073,729 | 12/1991 | Greene et al. | 326/47 |
| 5,144,166 | 9/1992 | Camarota et al. | 326/41 |
| 5,208,491 | 5/1993 | Ebeling et al. | 326/41 |
| 5,224,056 * | 6/1993 | Chene et al. | 716/7 |
| 5,243,238 | 9/1993 | Kean | 326/41 |
| 5,260,610 | 11/1993 | Pedersen et al. | 326/41 |
| 5,260,611 | 11/1993 | Cliff et al. | 326/39 |
| 5,260,881 | 11/1993 | Agrawal et al. | 395/500.17 |
| 5,267,187 | 11/1993 | Hsieh et al. | 708/700 |
| 5,349,250 | 9/1994 | New | 326/44 |
| 5,357,153 | 10/1994 | Chiang et al. | 326/40 |
| 5,365,125 | 11/1994 | Goetting et al. | 326/39 |
| 5,455,525 | 10/1995 | Ho et al. | 326/41 |
| 5,457,410 | 10/1995 | Ting | 326/41 |
| 5,469,003 | 11/1995 | Kean | 326/39 |

(List continued on next page.)

FOREIGN PATENT DOCUMENTS

0461798A2   6/1991  (EP) .......................... H03K/19/177

OTHER PUBLICATIONS

Shahookar et al. ("VLSI Cell Placement Techniques", ACM Computing Surveys, vol. 23, No. 2, Jun. 1991, pp. 143–220).*

Xilinx, Inc., "The Programmable Logic Data Book" 1996, available from Xilinx, Inc., 2100 Logic Drive, San Jose, CA 95124, pp. 4–11 to 4–23 and 4–32 to 4–37, Jul. 30, 1996.

Lucent Technologies, Microelectronics Group, ORCA, "Field–Programmable Gate Arrays Data Book," Oct. 1996, pp. 2–9 to 2–20.

Altera Corporation, "FLEX 10K Embedded Programmable Logic Family Data Sheet" from the Altera Digital Library, 1996, available from Altera Corporation, 2610 Orchard Parkway, San Jose, CA 95134–2020, pp. 31–53, Jun. 1996.

G. De Micheli et al., "Design Systems for VLSI Circuits, Logic Synthesis and Silicon Compilation" 1987, Martinus Nijhoff Publishers, Dordrecht, pp. 113–195. ISBN 90–247–3561–0, Jan. 1987.

* cited by examiner

Primary Examiner—Paul R. Lintz
Assistant Examiner—Phallaka Kik
(74) Attorney, Agent, or Firm—Adam H. Tachner, Esq.; Crosby, Heafey, Roach & May; Lois D. Cartier

(57) ABSTRACT

A modification to the available simulated annealing algorithm is provided to better utilize direct connects and other architecture-specific features of a Field Programmable Gate Array. A preferred embodiment comprises adding a template-based move to the SA move-set that recognizes a specific pattern or template in the user's design after mapping, and arranges the components into the optimal configuration for the specific template discovered. The present invention increases the intelligence of the SA move-set by selectively supplementing the random moves in the move-set with moves that produce locally good solutions.

16 Claims, 5 Drawing Sheets

U.S. PATENT DOCUMENTS

| | | | |
|---|---|---|---|
| 5,513,124 | * | 4/1996 | Trimberger et al. .................... 716/7 |
| 5,581,199 | | 12/1996 | Pierce et al. .......................... 326/41 |
| 5,598,343 | * | 1/1997 | Roy et al. ............................. 716/16 |
| 5,629,886 | | 5/1997 | New ..................................... 708/711 |
| 5,764,954 | * | 6/1998 | Fuller et al. .......................... 716/16 |
| 5,768,479 | * | 6/1998 | Gadelkarim et al. ................. 706/52 |
| 6,006,022 | * | 12/1999 | Rhim et al. ............................ 716/1 |
| 6,014,509 | * | 1/2000 | Furtek et al. ......................... 716/16 |
| 6,035,106 | * | 3/2000 | Carruthers et al. .................... 703/1 |

1  $\underline{x} = \underline{x}_O$, $T = T_O$
2  while not *frozen($\underline{x}$,T)*
3      while not *done_at_temperature($\underline{x}$,T)*
4          $\underline{x} + \Delta\underline{x} = $ *generate($\underline{x}$)*
5          if *accept($\underline{x}$, $\underline{x} + \Delta\underline{x}$, T)* then
6              $\underline{x} = \underline{x} + \Delta\underline{x}$
7      $T = $ *update_temp(T)*

FIG. 1
(Prior Art)

User's Design

FPGA

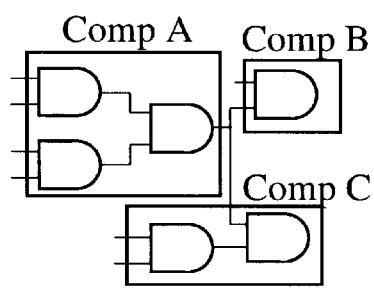
FIG. 8A
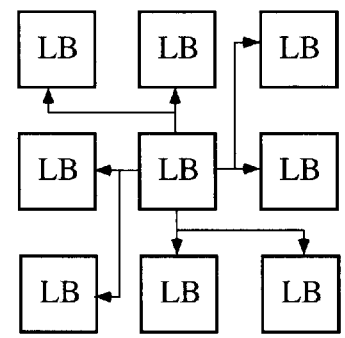
FIG. 8B
|  | Col 0 | Col 1 | Col 2 | Col 3 | Col 4 |
|---|---|---|---|---|---|
| Row 0 |  |  |  |  | B |
| Row 1 |  |  |  | Q |  |
| Row 2 |  |  | A | R |  |
| Row 3 |  |  |  |  |  |
| Row 4 |  | C |  |  |  |
FIG. 8C
|  | Col 0 | Col 1 | Col 2 | Col 3 | Col 4 |
|---|---|---|---|---|---|
| Row 0 |  |  |  |  | Q |
| Row 1 |  |  |  | B |  |
| Row 2 |  |  | A | C |  |
| Row 3 |  |  |  |  |  |
| Row 4 |  | R |  |  |  |
FIG. 8D

TEMPLATE-BASED SIMULATED ANNEALING MOVE-SET THAT IMPROVES FPGA ARCHITECTURAL FEATURE UTILIZATION

CROSS REFERENCE TO RELATED APPLICATIONS

This application is related to concurrently filed and commonly assigned U.S. patent application Ser. No. 08/982,636, now U.S. Pat. No. 6,069,490, invented by Emil S. Ochotta and Douglas P. Wieland, entitled "ROUTING ARCHITECTURE USING A DIRECT CONNECT ROUTING MESH", which is incorporated herein by reference.

FIELD OF THE INVENTION

The present invention relates generally to the field of logic mapping, placement and routing in programmable logic devices, and particularly to mapping, placement and routing in Field Programmable Gate Arrays ("FPGAs").

BACKGROUND OF THE INVENTION

Simulated annealing ("SA") is a method of optimizing properties of large, complex systems. Essentially, SA is optimization via random search. New states in the system are chosen at random, then compared to the current state and either accepted in place of the current state, or rejected. This random search continues until the system has converged to a final state that is acceptable based on a problem-specific cost function.

SA derives its name from a useful analogy drawn from the annealing of solids involving melting a substance, then carefully cooling it until a highly regular crystalline structure is formed. Making an analogy to the optimization of large, complex systems (such as the placement and routing of circuit elements in an FPGA), the cost function that describes the quality of a particular state of the system (implementation efficiency, or quality of the place and route solution) corresponds to the energy in the substance being annealed, variables in a system correspond to atoms in the substance being annealed, and the minimum in the cost function discovered during the optimization process corresponds to the highly regular crystalline structure that results from annealing.

The key innovation in SA was the introduction of effective temperature, T, into complex system optimization via random search. As with annealing of solids, the simulated annealing process begins with a high effective temperature and slowly reduces it. When the effective temperature has decreased such that the system being optimized has settled into a minimum in the cost function, C, the optimization process is complete.

Given an initial problem state, $X_0$ and an initial temperature, $T_0$, a pseudo-code description of an available SA algorithm is shown in FIG. 1.

At the core of the algorithm shown in FIG. 1 are the two functions generate and accept. How the annealer generates a new problem state given the current state is encoded in the function generate (on line 4 of FIG. 1). Function accept on line 5 determines whether the newly generated problem state replaces the current problem state. Using SA, new states are accepted not only when they cause a decrease (i.e., an improvement) in the cost, but, with a probability based on the temperature, also when they cause an increase in the cost. The probability of acceptance of states that increase cost lowers as temperature decreases. This behavior is codified in the accept function for SA, which is defined in Equation 1:

$$\text{accept} = \text{TRUE if } \left[ \text{random} < e^{\frac{\{C(x) - C(x + \Delta x)\}}{T}} \right] \quad \text{(EQ. 1)}$$

In Equation 1, random is a function that returns a uniform random number on the interval [0,1]. The behavior of Equation 1 is shown conceptually in FIGS. 2A and 2B. Downhill moves are moves to a new state with a lower cost than the present state, while uphill moves increase the cost. For a downhill move, $C(x)-C(x+\Delta x)$ is positive, and the exponent in Equation 1 will be positive, so the function on the right of the inequality will yield a value larger than one. Since the range of random is [0,1], these downhill moves are accepted. The probability of accepting an uphill move depends on the ratio of the change in the cost function to the present temperature. For very hot temperatures, this ratio is small (the denominator in the exponent is far greater than the numerator) and almost all uphill moves are accepted. When the temperature has cooled such that it is only warm (FIG. 2A), the probability of accepting a large uphill move is substantially reduced, but many smaller uphill moves are still accepted. When the temperature is reduced further to cool, the probability of accepting uphill moves also decreases, as illustrated in FIG. 2B. This probability continues to drop until almost no uphill moves are accepted. At this point, the problem settles into the bottom of a valley in the cost surface and is considered to be frozen. Hot, warm, and cool temperatures are problem-specific; i.e., different systems will accept or reject states at different temperatures.

Returning again to FIG. 1, the functions frozen, update_temp, and done_at_temperature determine when annealing is finished, how the temperature is updated, and how many moves should be performed at each temperature, respectively. The initial temperature, $T_0$, and these critical control functions are collectively referred to as the cooling schedule. Optimal cooling schedules have been the subject of much research and selection of an appropriate schedule is crucial to an efficient implementation. However, discussion of cooling schedules is beyond the scope of this background discussion and will be understood by one skilled in the art to which the present invention pertains without additional discussion.

Any SA solution to a specific problem can be described in terms of the four principal components of the algorithm:
  x, the problem representation, which maps the problem being solved into the current state within the annealer;
  generate, which implements the annealer's move-set (the set of possible perturbations referred to in Equation 1 as $\Delta x$, used by the annealer to manipulate the current state;
  C(x), the cost function, which determines how the cost is calculated and what its components are;
  and the cooling schedule, which controls T, directing the overall cooling process.

The most important decision to be made when designing an annealing implementation is how to handle constraints inherent in the problem being solved. For example, when trying to optimally place transistors on an integrated circuit (IC), the final solution is constrained such that none of the transistors can overlap. One way to handle these constraints within an annealing formulation is to penalize problem states that violate these constraints, by including penalty terms in the cost function. These penalty terms can be weighed against the other design objectives by using scalar weights, resulting in a weighted penalty function. However, not all constraints need be handled with a weighted penalty function; many constraints can be implemented either in the cost function or in the move-set. For example, simple bounds on the decision variables can be easily implemented in the move-set by simply not generating moves beyond the variable bounds. However, for more complex constraints, implementation is not so straightforward. In the case of optimal transistor placement on ICs, the constraint that transistors cannot overlap can be implemented by designing the move-set such that they never overlap, or by designing a cost function that penalizes illegal overlaps. Although the move-set approach is the most obvious solution, the cost function solution is easier to implement and is generally accepted as superior. The designer of any SA solution to a realistic problem will be faced with similar design trade-offs.

Annealing for FPGA Placement

The placement problem in FPGAs is often solved with SA. An FPGA is a regular, two-dimensional grid of logic blocks ("LBs"). Each LB can be programmed to perform a single, small function. Programmable routing connects the LBs.

The initial state of the user=s design and FPGA are shown conceptually in FIG. 3. The user's design is on the left and is a collection of interconnected gates. The grid on the right shows the empty FPGA, where each square (defined by a unique coordinate pair) is an LB. The routing structure is not shown. A user's complete digital design is typically implemented on the FPGA in three steps: mapping, placement, and routing.

The mapping step comprises collecting gates into interconnected pieces called components. The results of the mapping step are shown in FIG. 4. Each component is small enough to fit within a single LB.

Placement determines which LB in the FPGA to use for each component. The results of the placement step are shown in FIG. 5. The placement problem starts with a set of unplaced components. When complete, placement produces an (x,y) location for each component. These (x,y) locations are the grid co-ordinates of the LB that the component will occupy on the FPGA.

The final step, routing (not shown), determines how to program the programmable interconnect structure of the device such that the connections on the FPGA are compatible with those in the user's design.

In SA terms of move-set, cost function, and cooling schedule, the FPGA placement problem is typically formulated as follows:

Problem representation: The problem is represented as the set of (x,y) co-ordinates that comprise the LB locations for all components in the user's design. Initial locations are assigned randomly for all the components, ensuring simply that the locations are legal (e.g., each location is unique). Thus, throughout the SA run, a component will always have a valid LB location.

Move-set: The usual move-set typically contains only random swaps. A random swap first selects two LB locations randomly, then swaps the components at those locations. (One of these locations can be empty, with no ill effect).

Cost function: The typical goal for a good implementation of a user's design on an FPGA is to minimize the interconnect delay (a function of distance and complexity of the interconnect path) between components. The actual interconnect delays cannot be known until the FPGA is routed, which is not performed until after placement. As a result, the placer's cost function simply estimates delay.

Cooling schedule: Cooling schedules can be formulated that are independent of the particular problem domain. Assuming that such a schedule is used, further discussion of cooling schedules is not relevant to this background discussion.

Architecture-Specific Feature Utilization

One approach to avoiding complicated routing structures in FPGAs is the inclusion of special structures called direct connects between logic elements. For example, in the XC3000 device from Xilinx, Inc., assignee of the present invention, each LB connects to the four LBs to its north, south, east and west, as illustrated in FIG. 6. The X output may be connected directly (i.e., through only one programmable interconnect point (PIP)) to the B input of the LB immediately to its right and the C input of the LB immediately to its left. Similarly, the Y output may be connected directly (through only one PIP) to the D input of the LB immediately above and the A input of the LB immediately below. Similarly, the Xilinx XC4000EX includes four direct connects per LB: two vertical and two horizontal. A simplified view of this structure is illustrated in FIG. 7. Horizontal direct connects 4 connect subject LB 2 to adjacent LB 6 on the right, and vertical direct connects 8 connect subject LB 2 to LB 10 adjacent below. A new direct connect structure is also disclosed by Ochotta and Wieland in U.S. Pat. No. 6,069,490 entitled ROUTING ARCHITECTURE USING A DIRECT CONNECT ROUTING MESH, which is incorporated herein by reference.

There have been a number of approaches taken to FPGA placement utilizing simulated annealing. To attempt to improve utilization of special architectural features such as direct connects, three kinds of techniques have been used.

A first approach is to modify the cost function to encourage direct connects and other architecture-specific features to be used. In this manner, placements that use these architecture-specific features are assigned low cost, so that the normal annealing algorithm will tend to create placements that use these features. However, with a completely random move-set, the probability that a significant number of desired, architecture specific features will be used remains quite small.

A second approach is to recognize patterns in the user's design and place some components in locally optimal locations before SA is executed. The pre-placed components are not moved during annealing. One problem with this technique is that the pre-placed components may be optimally placed with respect to each other, but may be non-optimal in the context of the overall design.

A third available approach is to perform annealing as usual and then attempt to optimize the final placement to use more architecture specific features. The problem with this technique is that the locations needed to use the architecture-specific features may be occupied by other uninvolved components. Finding new locations for the displaced components is very difficult, and the new locations for those components may displace yet more components. In fact, in the general case, using this technique is tantamount to starting the entire placement process over again.

Thus, key to effective utilization of architecture-specific features such as direct connects is awareness of their existence and location. Second, and just as important, is proper and advantageous use of the direct connects, since an implementation of a design is only as fast as the slowest path. For example, if the critical path for a signal is actually an 8-bit bus, all 8 bits in the bus must take similar advantage of direct connects. No advantage is gained if one of the bits uses direct connects to be faster than the other seven bits, since all bits on the bus must be received before processing can continue.

Direct connect utilization is most effectively addressed during placement, since it is assumed that if logic blocks are placed so that they can be routed with direct connects, the router will find this direct connection without any difficulty. Unfortunately, when using optimization techniques such as available simulated annealing algorithms, placing components so that they can take advantage of direct connects is fairly unlikely. This is particularly true when there are only two possible relative placements of a pair of blocks that can use a direct connect. Because available SA algorithms move blocks randomly, trying to find one of only two ideal solutions in a large number of random perturbations makes SA a highly inefficient mechanism for utilizing valuable device resources.

We can therefore see that architecture-specific features such as direct connects are used only under very specific circumstances and SA by its nature is not effective for finding special cases. For example, a direct connect can be used only when a component and its signal driving mate are placed into directly connected LBs. Given the number of possible valid placements of components in LBs on a real FPGA, random placements would rarely utilize direct connects. Given that the standard SA algorithm is driven by random moves, direct connect utilization in placement done by available SA algorithms is likely to be poor.

Thus, efficient and effective utilization of direct connect resources in FPGAs requires improvements in the available art.

SUMMARY OF THE INVENTION

To address the shortcomings of the available art, the present invention provides modifications to the available SA algorithm to better utilize direct connects and other architecture-specific features of an FPGA. A preferred embodiment comprises adding a template-based move to the SA move-set. A template-based move is a move that recognizes a specific pattern or template (i.e., a predetermined correlation) in the user's design after mapping, and arranges the components into the optimal configuration for the specific template discovered.

More specifically, the present invention increases the intelligence of the SA move-set by selectively supplementing the random moves in the move-set with moves that produce locally good solutions. The cost function mechanism then determines whether the locally good solutions are also good globally.

In a specific example dealing with direct connects, the present invention provides for adding a move that traces an output signal with low fanout and transfers all of its loads so that they can be driven with a direct connect. This move works in concert with the random moves being used by the annealer and results in significant improvements in direct connect utilization when compared with annealing that uses only random moves.

It is therefore a first advantage of the present invention that certain desired device features are utilized when appropriate, creating a more efficient circuit implementation.

Another advantage of the present invention is allowance of the natural annealing action and the cost function to determine the best overall placement while introducing the locally optimal placements for consideration.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings in which:

FIG. 1 is a prior art pseudo-code description of a Simulated Annealing algorithm;

FIGS. 8A–8D illustrate the effect and proper function of a preferred embodiment of the improved optimization algorithm of the present invention.

DETAILED DESCRIPTION OF THE DRAWINGS

Figure 2A:
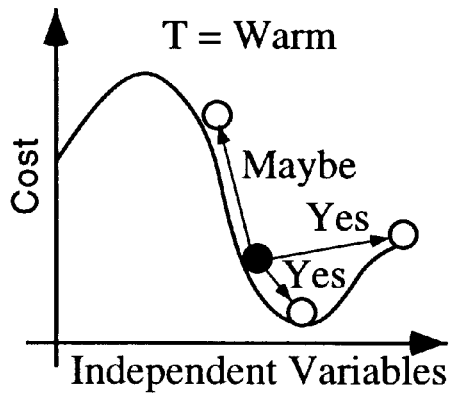
FIGS. 2A and 2B illustrate the function of the Simulated Annealing algorithm of FIG. 1.
Figure 2B:
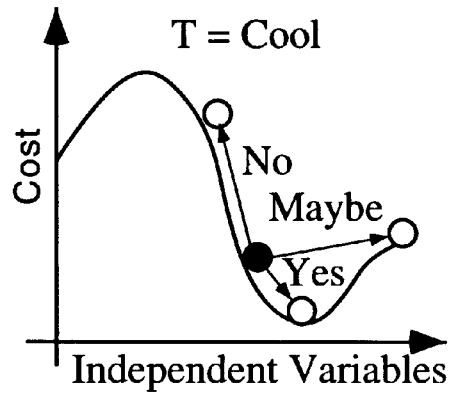
Figure 3:
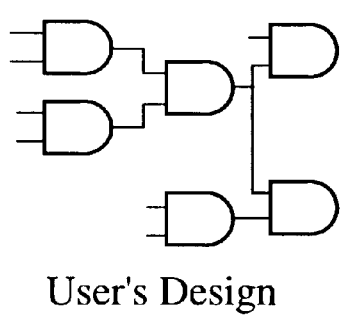
FIG. 3 illustrates the initial conditions encountered before mapping a design to an FPGA.
Figure 3:
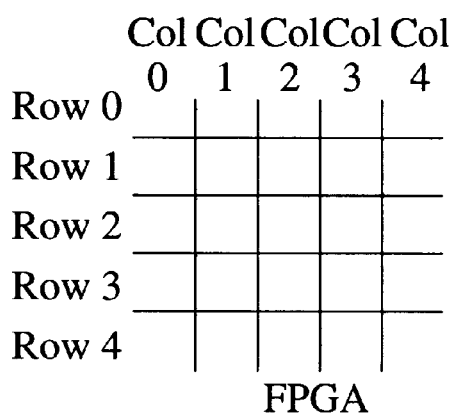
Figure 4:
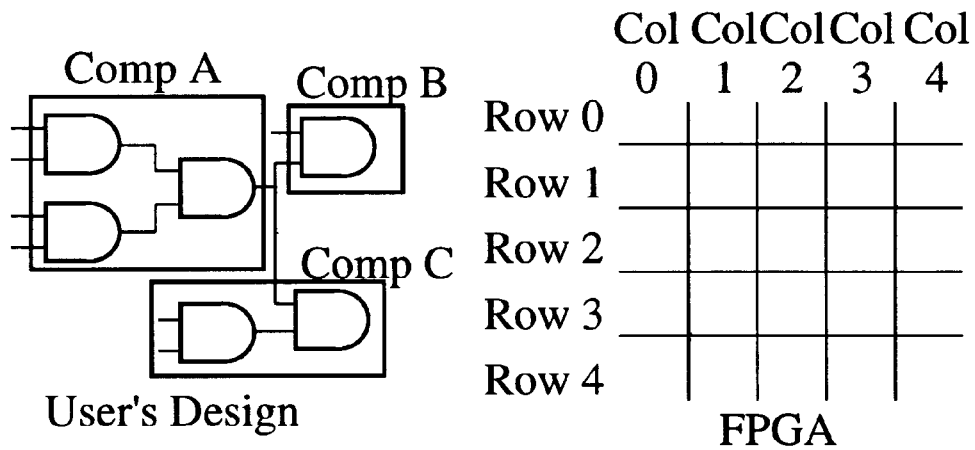
FIG. 4 illustrates the result of mapping a design to an FPGA.
Figure 5:
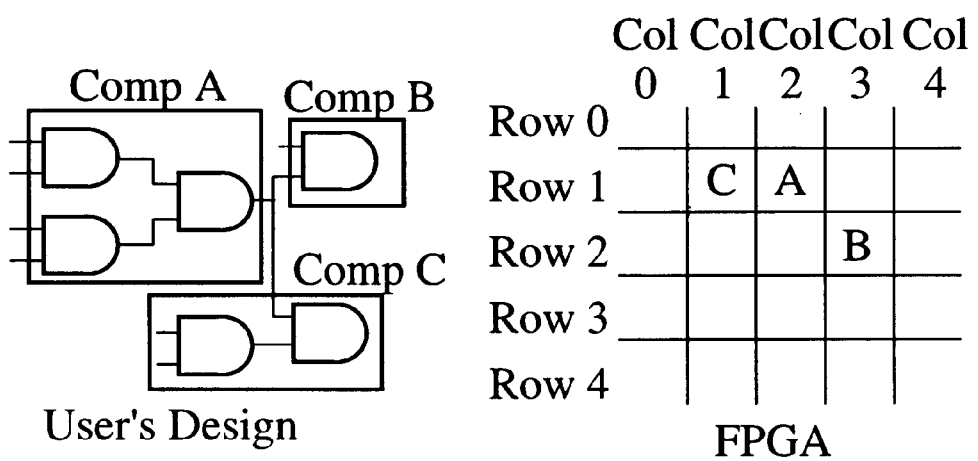
FIG. 5 illustrates the result of placing a mapped design in an FPGA.
Figure 6:
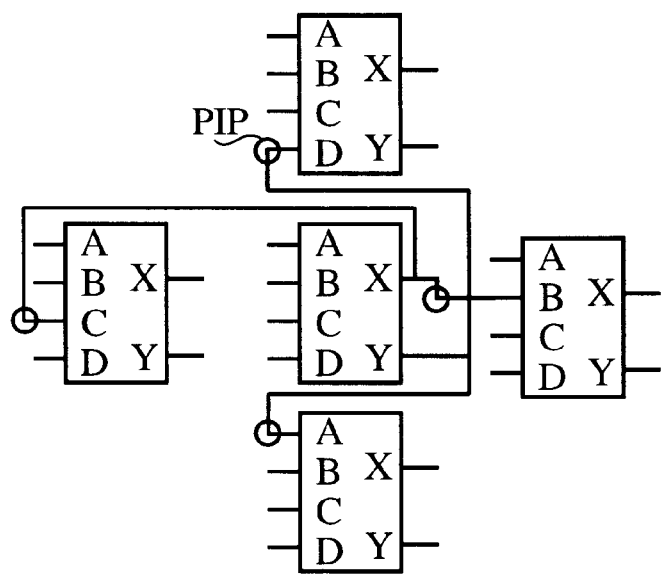
FIG. 6 illustrates a first prior art direct connect interconnect structure.
Figure 7:
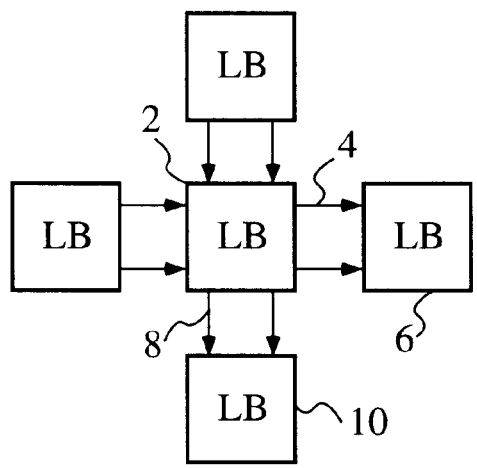
FIG. 7 illustrates a second prior art direct connect interconnect structure.

Referring first to the example in FIGS. 8A–D, partial results of mapping the user's design are shown in FIG. 8A, which shows a subset of the components created by mapping. FIG. 8B shows a direct-connect mesh built into example FPGA hardware, as described in U.S. patent application Ser. No. 08/982,636. In this example, the connections from component A to components B and C can be sped up by using the direct-connect mesh. A template-based move recognizes configuration of components A, B and C as a candidate for using direct connects and re-arranges the components on the FPGA to take advantage of the direct connects, as illustrated in FIGS. 8C and 8D. FIG. 8C shows the placement of some of the components in the user's design before the template-based move is performed. Here, the components Q and R are other components in some other part of the user's design not shown. FIG. 8D shows the placement of these same components after the template-based move has been completed. The template-based move recognized that the connection between components A and B could utilize a direct-connect if components B and Q were swapped, so it performed the swap. A similar swap was performed for components C and R.

In general, for an FPGA architecture with a direct-connect mesh or other architecture-specific features, the improved simulated annealing algorithm of the present invention only modifies the existing SA algorithm by addition of template-based moves to the move-set (also requiring at least some tuning of the algorithm implementation due to the concomitant change in algorithmic properties accompanying a move-set alteration). The addition of template-based moves to random moves will be readily understood by one skilled in the art to which the present invention pertains because in most prior art annealers there are already a plurality of random move types. For example, annealers often define small, medium, and large moves based on the distance the component moves.

Prior art annealers typically choose among the kinds of moves to use with one of the following techniques:
 Cycle through the available kinds of moves. In this case, a given kind of move is performed at fixed intervals.
 Place a move type in the list of available move types more than once to allow more frequent performance of some moves.

Assign a fixed probability to each move, instead of having a fixed list of move types. A random number generator is then employed to randomly select the move type with a frequency based on its assigned probability.

Instead of using a fixed probability, the probability of selecting a given move type is varied over the course of the algorithm. For example, probabilities can be assigned in proportion to the effectiveness of the given move type.

A general description of the template-based move of the present invention is that it performs the following steps:
1. Study the mapped user's design to determine where template-based moves can be applied. For increased efficiency, this step is preferably performed at the beginning of the placement run.
2. Randomly select an LB location that has a component assigned to it that participates in one of the templates found in step 1 (e.g., component A in FIG. 8C).
3. Identify the other components that participate in the template (e.g., components B and C in FIG. 8A), and determine their current locations.
4. To take advantage of a specific feature on the FPGA, dictate the optimal configuration for the set of components identified in step 2 (e.g., the direct connect mesh in FIG. 8B dictates that components B and C must be adjacent to component A).
5. Move all the components identified in step 2 into their locally optimal configuration. If some of the needed LBs are occupied, swap out those components (e.g., the direct connect mesh in FIG. 8B dictates that components B and C must be adjacent to component A).

It should be noted here that, at the end of a placement, not every component will end up in a locally optimal location for at least the following reasons:
1. There may be components that are not part of any template.
2. There may be components that are in more than one template and the templates conflict.
3. The cost function ultimately controls the overall placement. The template-based moves produce solutions that are optimal only for the components involved with the template, and these may not be optimal in the context of the overall placement. Since random moves are still part of the move-set, the interaction of the random moves and the cost function may still create solutions where components are not in the locations dictated by any template-based moves.

In a preferred embodiment, templates are created for a large variety of possible configurations of components in the user's design. Components in a user's design are not limited to components that fit into LBs. Component is a generic name that can be applied to groups of logic that fit into input/output blocks (IOBs), tristate buffers (TBUFs), carry logic, RAM, or any other hardware element on the FPGA. As such, templates that recognize any structure for which there is specific hardware support on the FPGA are contemplated as coming within the scope of the present invention. Examples include busses implemented with TBUFs, carry logic chains, gates wider than can fit in a single LB, bus structures, and arithmetic functions such as multipliers.

Recognizing templates in the user's design is accomplished in one of several ways. Preferably, this task is a pre-processing step before annealing begins, saving the locations of the recognized patterns. The preferable algorithm for recognizing patterns in the user's design is to treat the problem as one of graph isomorphism by hashing. Hashing is the process of creating a single number that represents the pattern. The preferred embodiment includes hashing the available templates, then hashing the user's design looking for matching hash values. For example, a simple hash function might be to count 1 for components that can fit into LBs, then add 10 for each driven LB component. Thus, the hash value for component A in FIG. 8A is 1+10+10=21. This process is performed initially for all of the patterns of components that define template-based moves. Then, the process is repeated for each component in the user's design. If the hash value for a particular component matches the hash value for one of the template-based moves, a more detailed comparison is performed to determine whether the template is actually applicable. In practice, a much more sophisticated hash function might be used to decrease the likelihood of false matches. Such hash functions are well-known to those of ordinary skill in the programming art.

Finally, a few of the important features which distinguish the template-based moves of the present invention from any previous work are: 1) there are no mathematical gradients used in template-based moves (since there is no closed form cost function for FPGA placement, gradients are not practical in the FPGA placement domain); 2) template-based moves move components into a configuration that is optimal only for the components involved in the move. The overall placement as a result of this move may be either better or worse, as determined by the cost function in a manner independent of the move-set. This type of move is distinct from gradient-based moves because the gradients point towards local minima for the global cost function; and 3) template-based moves are targeted specifically at taking advantage of architecture-specific features of FPGA hardware that would otherwise be difficult to utilize.

While the present invention has been described with reference to certain preferred embodiments, those skilled in the art will recognize that various modifications and other embodiments may be provided. For example, the template-based moves added to the move-set may be compatible with features other than direct connects. These and other embodiments are intended to fall within the scope of the present invention, which is limited only by the following claims.

What is claimed is:

1. A method of allocating a plurality of integrated circuit device elements to implement a circuit design in a programmable device having a localized routing structure, each such element having a position on the device, the method comprising the steps of:

a) mapping the design into a plurality of blocks, each of the blocks corresponding to a single element on the device;

b) placing the blocks according to an iterative algorithm; and c) during said placing step, scanning the design for a plurality of design elements that can be advantageously interconnected using the localized routing structure, and upon locating such a plurality of design elements, altering the placement of the blocks in a non-random fashion to accommodate the localized routing structure.

2. The method of claim 1 further comprising the steps of:

d) comparing the altered placement of the blocks to a pre-altered placement of the blocks; and e) based on the results of comparing the altered placement of the blocks to the pre-altered placement of the blocks, canceling the altered placement.

3. A method of allocating a plurality of integrated circuit device elements to implement a circuit design in a programmable device, each such element having a position on the device, the method comprising the steps of:
a) mapping the design into a plurality of blocks, each of the blocks corresponding to a single element on the device;
b) placing the blocks according to an iterative algorithm; and
c) during said placing step, scanning the design for a plurality of design elements having a predetermined correlation with one another, and upon locating such a plurality of design elements, altering the placement of the blocks in a non-random fashion to accommodate the predetermined correlation in the implemented circuit,
wherein in step b) the iterative algorithm is simulated annealing.

4. The method of claim 3 wherein the design is scanned for a plurality of design elements having a predetermined correlation with one another at the beginning of the simulated annealing process.

5. A method of allocating a plurality of integrated circuit device elements to implement a circuit design in a programmable device having a localized routing structure, each such element having a position on the device, the method comprising the steps of:
a) segmenting the design into a plurality of blocks, each of said blocks corresponding to a single element on the device;
b) placing said blocks among said elements on the device;
c) randomly swapping said blocks to improve an estimated efficiency of an implementation resulting from said placement; and
d) scanning the design for a plurality of design elements that can be advantageously interconnected using the localized routing structure, and upon locating said plurality of design elements, non-randomly altering the placement of said blocks to accommodate said localized routing structure.

6. A method of re-allocating a plurality of components previously allocated to logic blocks in an FPGA design, the FPGA having a localized routing structure, the method comprising the steps of:
a) studying the design to determine where a template can be applied in order to take advantage of the localized routing structure;
b) selecting one such template;
c) randomly selecting a logic block having a component assigned to it to participate in the selected template;
d) identifying other components that participate in the selected template;
e) determining the current location of the other components participating in the selected template; and
f) moving the components participating in the selected template in a non-random fashion, the moving resulting in a configuration matching the configuration of the template.

7. The method of claim 6, wherein step f) further comprises exchanging at least one component participating in the selected template with another component not participating in the template, thereby making room for the participating component.

8. A method of iteratively placing a plurality of components from a logic circuit into a programmable device, the programmable device comprising an array of logic blocks, each component including logic that can be implemented in one logic block, each component being assigned to one logic block in the array, thereby creating an initial placement, the method comprising;
performing a random iteration, the random iteration comprising:
randomly swapping the assignments of at least two logic blocks, whereby creating a first resulting placement; and
evaluating the first resulting placement; and
performing a non-random iteration, the non-random iteration comprising:
scanning the logic circuit and locating a plurality of components having a predetermined correlation according to a predetermined template;
non-randomly swapping the assignments of at least two logic blocks such that the predetermined correlation is preserved, thereby creating a second resulting placement; and
evaluating the second resulting placement.

9. The method of claim 8, wherein the step of performing a random iteration precedes the step of performing a non-random iteration.

10. The method of claim 9, further comprising:
after performing the non-random iteration, comparing the second resulting placement to the first resulting placement;
calculating an accept function value for the second resulting placement; and
based on the results of comparing the second resulting placement to the first resulting placement, and further based on the accept function value, returning to the first resulting placement.

11. The method of claim 8, wherein the step of performing a random iteration follows the step of performing a non-random iteration.

12. The method of claim 11, further comprising:
after performing the random iteration, comparing the first resulting placement to the second resulting placement;
calculating an accept function value for the first resulting placement; and
based on the results of comparing the first resulting placement to the second resulting placement, and further based on the accept function value, returning to the second resulting placement.

13. The method of claim 8, further comprising:
creating a library of predetermined templates; and
prior to the step of scanning the logic circuit, selecting the predetermined template from the library of predetermined templates.

14. A method of iteratively placing a plurality of components from a logic circuit into a programmable device comprising an array of logic blocks, each component including logic that can be implemented in one logic block, the method comprising:
assigning each component to one logic block in the array; and
changing the assignments of at least two logic blocks using a modified simulated annealing algorithm, the modified simulated annealing algorithm including a series of swapping steps,
a first group of the swapping steps randomly swapping the assignments of at least two logic blocks, and
a second group of the swapping steps non-randomly swapping the assignments of at least two logic blocks by scanning the logic circuit, locating a plurality of components having a predetermined correlation according to a predetermined template, and swapping the assignments of the at least two logic blocks to correlate the logic blocks according to the template.

15. The method of claim 14, wherein each of the first group of swapping steps results in a random placement, and each of the second group of swapping steps results in a non-random placement, the step of changing the assignments of at least two logic blocks using a modified simulated annealing algorithm further comprising:

comparing a first non-random placement to a first random placement;

calculating an accept function value for the first non-random placement; and based on the results of comparing the first non-random placement to the first random placement, and further based on the accept function value, returning to the first random placement.

16. The method of claim 14, further comprising:

creating a library of predetermined templates; and prior to the step of changing the assignments of at least two logic blocks using a modified simulated annealing algorithm, selecting the predetermined template from the library of predetermined templates.

\* \* \* \* \*